United States Patent
Lu et al.

(10) Patent No.: US 7,479,466 B2
(45) Date of Patent: Jan. 20, 2009

(54) METHOD OF HEATING SEMICONDUCTOR WAFER TO IMPROVE WAFER FLATNESS

(75) Inventors: Hsiao-Tzu Lu, Hsinchu (TW);
Burn-Jeng Lin, Hsinchu (TW);
Chin-Hsiang Lin, Hsinchu (TW);
Kuei-Shun Chen, Hsinchu (TW);
Tsai-Sheng Gau, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 186 days.

(21) Appl. No.: 11/486,098

(22) Filed: Jul. 14, 2006

(65) Prior Publication Data

US 2008/0014763 A1    Jan. 17, 2008

(51) Int. Cl.
*H01L 21/00* (2006.01)

(52) U.S. Cl. .................. 438/799; 438/530; 438/798; 257/E21.324; 257/E21.475

(58) Field of Classification Search .................. 438/799, 438/798, 530, 522, 457, 509; 257/E21.324, 257/E21.475, E21.471, E21.147
See application file for complete search history.

(56) References Cited

U.S. PATENT DOCUMENTS

| | | | | |
|---|---|---|---|---|
| 4,331,485 A | * | 5/1982 | Gat | 438/795 |
| 5,141,894 A | * | 8/1992 | Bisaro et al. | 438/479 |
| 5,629,532 A | * | 5/1997 | Myrick | 257/77 |
| 7,135,714 B2 | * | 11/2006 | Okazaki et al. | 257/99 |
| 2003/0209717 A1 | * | 11/2003 | Okazaki | 257/80 |
| 2006/0246672 A1 | * | 11/2006 | Chen et al. | 438/301 |
| 2007/0254439 A1 | * | 11/2007 | Chien | 438/285 |
| 2007/0262295 A1 | * | 11/2007 | Enicks | 257/19 |
| 2008/0014740 A1 | * | 1/2008 | Chou et al. | 438/622 |

* cited by examiner

*Primary Examiner*—Caridad M Everhart
(74) *Attorney, Agent, or Firm*—Birch, Stewart, Kolasch & Birch, LLP

(57) ABSTRACT

A method of heating-treating a semiconductor wafer is provided. In one embodiment, a first layer is formed over a first side of a substrate. A second layer is formed over the first layer and over a second side of the substrate and the wafer is then flash annealed. In another embodiment, a first layer is formed over a first side of a substrate and over a second side of the substrate. A second layer is formed over the first layers and the wafer is then flash annealed.

30 Claims, 4 Drawing Sheets

US 7,479,466 B2

METHOD OF HEATING SEMICONDUCTOR WAFER TO IMPROVE WAFER FLATNESS

BACKGROUND

The present invention relates generally to methods for heat-treating semiconductor wafers, and more particularly to methods for heat-treating wafers to improve wafer flatness.

Many applications require heating or annealing of an object or workpiece. For example, in the manufacture of semiconductor chips such as microprocessors and other computer chips for example, a semiconductor wafer such as a silicon wafer is subjected to an ion implantation process, which introduces impurity atoms or dopants into a surface region of a device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high temperature.

However, the high temperatures required to anneal the device side also tend to produce undesirable effects. Because the wafer is subject to high thermal and physical stresses, it can be easily distorted instead of remaining flat as desired. Flatness is one of the most critical wafer parameters, primarily because the process of photolithography is highly sensitive to local-site flatness, especially for deep submicron photolithography. The annealing process creates a wafer that is not entirely flat and this creates difficulties for subsequent lithography alignment and poor overlay accuracy results. Lithography alignment is critical because the mask pattern must be precisely transferred to the wafer from layer to layer. Since multiple masks are often used during patterning, any overlay misalignment contributes to the total placement tolerances between the different features of the wafer surface (overlay budget). A large overlay budget essentially reduces the circuit density, which limits device feature sizes, and therefore, IC performance.

For these reasons and other reasons that will become apparent upon reading the following detailed description, there is a need for an improved method of heat-treating a semiconductor wafer to improve wafer flatness that avoids the wafer manufacturing problems associated with conventional wafer heat-treating methods.

SUMMARY

The present invention is directed to methods of heating treating a semiconductor wafer. In one embodiment, a first layer is formed over a first side of a substrate. A second layer is formed over the first layer and over a second side of the substrate and the wafer is then flash annealed. In another embodiment, a first layer is formed over a first side of a substrate and over a second side of the substrate. A second layer is formed over the first layers and the wafer is then flash annealed.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known processes and structures have not been described in detail to avoid unnecessarily obscuring the present invention.

Figure 1:
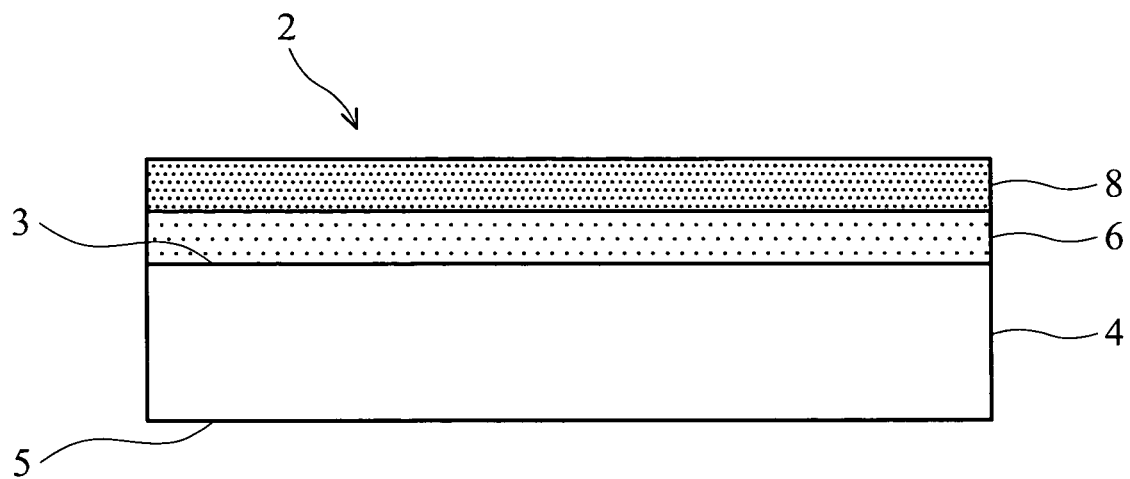
FIG. 1 is a cross-sectional view of a semiconductor device in an intermediate stage of manufacture showing the formation of a first layer over the device side of a substrate and a second layer over the first layer.

Referring to FIG. 1, a semiconductor wafer 2 is shown. Semiconductor wafer 2 is a silicon-based wafer used in the manufacture of semiconductor chips such as microprocessors and memory devices, for example. Semiconductor wafer 2 comprises a substrate 4, and first and second layers 6 and 8, respectively. Substrate 4 may comprise an elementary semiconductor (such as crystal silicon, polycrystalline silicon, amorphous silicon and germanium), a compound semiconductor (such as silicon carbide and gallium arsenide), an alloy semiconductor (such as silicon germanium, gallium arsenide phosphide, aluminum indium arsenide, aluminum gallium arsenide and gallium indium phosphide), combinations thereof and/or other materials. Substrate 4 may also comprise a semiconductor material on an insulator, such as a silicon-on-insulator (SOI) substrate, a silicon on sapphire (SOS) substrate, or a thin film transistor (TFT). Substrate 4 may also include a doped epitaxial layer and may also include a multiple silicon structure or a multilayer, compound semiconductor structure. A first side 3 of substrate 4 is a device side, while a second side 5 is a substrate side.

For the purposes of brevity and clarity and to show the applicability of rapid annealing to an ion implanted semiconductor wafer, substrate 4 has formed thereover, first layer 6 and second layer 8, which will be explained in more detail below. During the fabrication of a semiconductor device, parts of the device need to be protected while some other parts are processed. When, for example, memory and logic devices are fabricated on the same chip, electrical contacts on the logic part are made using the salicide (self aligned silicide) process, for example. To enable the selective salicidation of the logic side components, the memory part of the chip is protected from subsequent process steps with a resist protective oxide (RPO) layer. With reference to FIG. 1, first layer 6 is an RPO layer and is used for selective processing of specific areas of the silicon device. The RPO layer, which is an oxide, such as silicon dioxide, is deposited by conventional processing over substrate 4 and may have a thickness of about 100 to about 500 angstroms. The RPO layer may also comprise of other oxides, such as silicon nitride, silicon oxynitride, oxygen-doped silicon nitride, and/or nitrided oxides. After the step of forming first layer 6 over substrate 4, semiconductor wafer 2 may be subject to an anneal step to a temperature of about 400° C. The annealing may comprise of RTA (rapid thermal annealing). A second layer 8 or cap dielectric layer may then be deposited above first layer 6 by conventional PECVD (plasma enhanced chemical vapor deposition) or LPCVD (low pressure chemical vapor deposition) and second layer 8 may comprise of silicon dioxide. The cap dielectric layer makes dopant activation more uniform and suppresses ion penetration from device structures, such as the gate through the gate oxide during the high temperature RTA process. The cap dielectric layer may also be used as a resist protective oxide to block silicidation in unwanted areas of the device.

Figure 2:
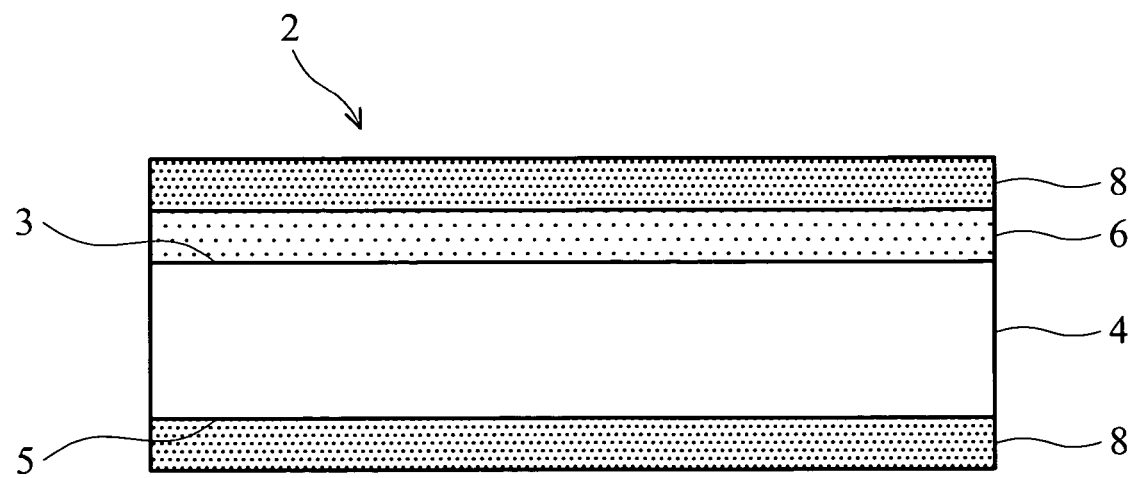
FIG. 2 is a cross-sectional view of a semiconductor device in an intermediate stage of manufacture showing the formation of a first layer over the device side of a substrate and a second layer over the first layer and over the substrate side of the substrate according to one aspect of the invention.
Figure 3:
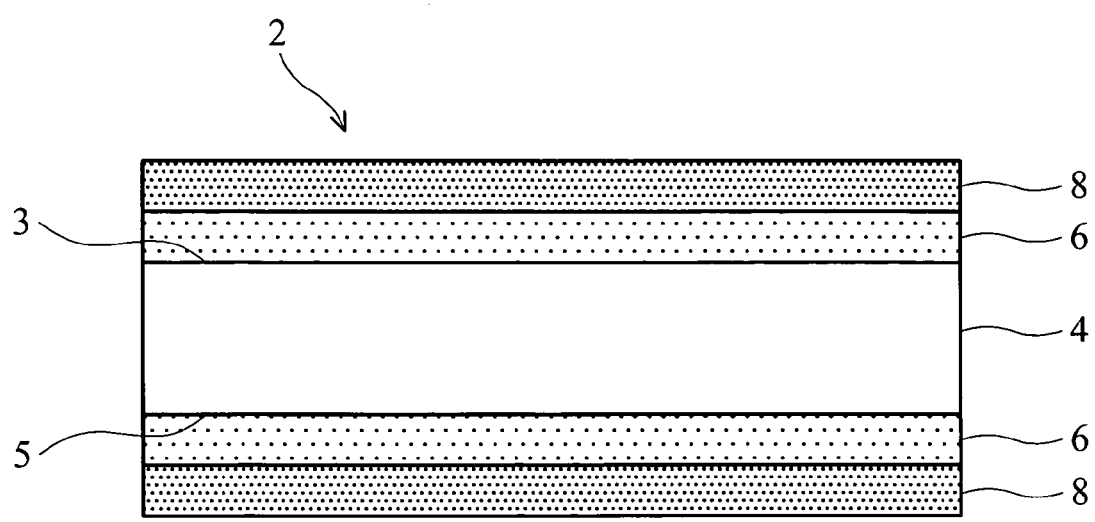
FIG. 3 is a cross-sectional view of a semiconductor device in an intermediate stage of manufacture showing the formation of a first layer over the device and substrate sides of a substrate and a second layer over the first layers according to one aspect of the invention.

Following deposition of first layer 6 and second layer 8, semiconductor wafer 2 is thereafter subjected to an ion implantation process to implant impurity or dopant atoms into surface regions of the device side. As a result of such ion implantation, the wafer suffers crystalline lattice damage, and the ion implants tend to remain concentrated largely at interstitial locations where they are electrically inactive. Therefore, the wafer must be subjected to an annealing process to force the implants into substitutional sites in the lattice of the silicon wafer thereby rendering them electrically active, and to repair the crystalline lattice damage suffered during ion implantations. But the high temperatures required to anneal the device side produce wafers that are not entirely flat and this creates difficulties for subsequent lithography alignment and poor overlay accuracy results. With reference to FIGS. 2 and 3 below, the present invention sets forth improved methods of heat-treating an ion-implanted semiconductor wafer to improve wafer flatness.

As in FIG. 1, FIG. 2 depicts a cross-sectional view of a semiconductor wafer 2 showing formation of a first layer 6 over the device side 3 of substrate 4 and a second layer 8 over the first layer 6. However, as shown in FIG. 2, the second layer 8 is also formed on the substrate side 5 of substrate 4. Second layer 8 or cap dielectric layer is deposited over first side 3 and second side 5 of substrate 4 by conventional PECVD (plasma enhanced chemical vapor deposition) or LPCVD (low pressure chemical vapor deposition) and second layer 8 may comprise of oxide, nitrogen, SiN, SiON, carbon, or amorphous carbon. One purpose of forming second layer 8 on the backside of the substrate is to counter-balance the physical forces or stresses first layer 6 and/or second layer 8 exert on substrate 4 during a subsequent flash anneal process. As is the case with the semiconductor wafer 2 of FIG. 1, after the step of forming first layer 6 over substrate 4, semiconductor wafer 2 may be subject to an anneal step. In one embodiment, the annealing comprises RTA (rapid thermal annealing) and first layer 6 is annealed to a temperature of about 500° C. to 1,500° C. at a time of less than about 3 milliseconds. Following formation of the second layer 8 over the first layer 6 and over the second side 5 of the substrate, the wafer 2 is next subject to a flash annealing process, according to aspects of the present invention.

Figure 4:
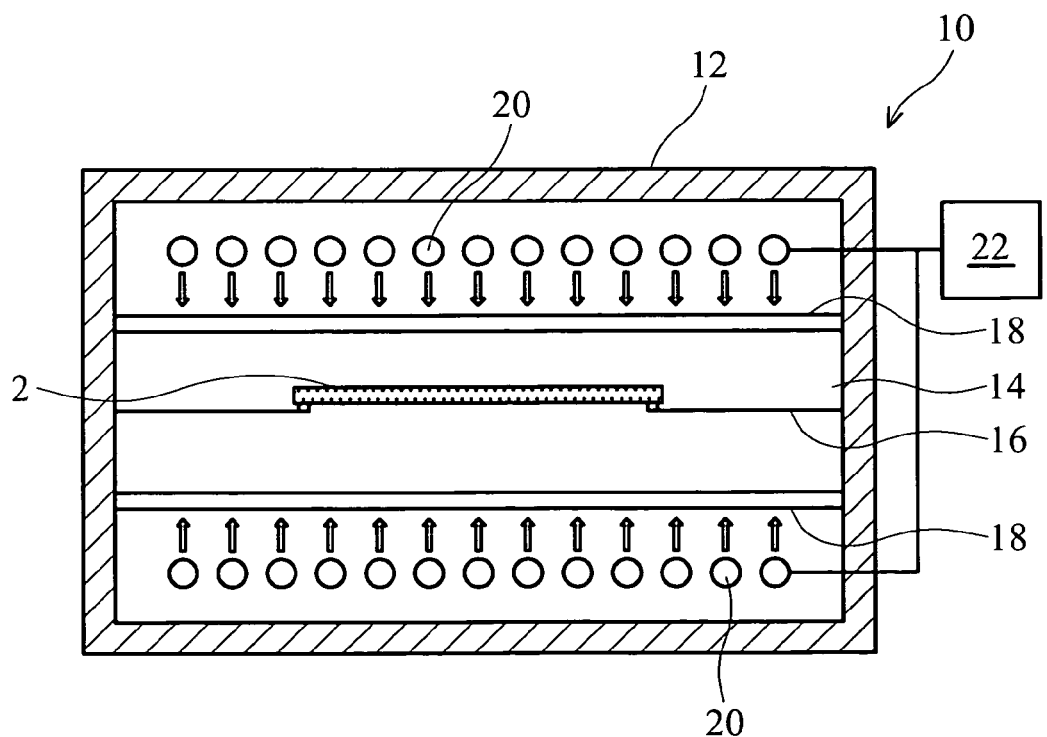
FIG. 4 is a schematic diagram of a heat processing system for heat treating semiconductor wafers according to one aspect of the invention.

Referring now to FIG. 4, a schematic diagram of a heat processing system for heat treating semiconductor wafers is shown. A heating system 10 includes a housing 12 defining a heat processing chamber 14 inside which is disposed a semiconductor wafer 2, held upon a support 16. Quartz windows 18 isolate the wafer 2 and support 16 from heating sources 20 disposed within housing 12, and are located both above and below the wafer 2. Heat sources 20 are controlled by a computer/control arrangement 22, which is configured for selectively applying an electrical power level to each of heating sources 20 to accomplish precise control of both sources. It is understood that control arrangement 22 is readily adaptable for controlling a multimode source in view of this overall disclosure, so as to deliver a heating profile from a single source or multi source, which combines flash heating behavior as well as background heating. Xenon lamps 20 are disposed in a parallel array above the front side or device side of the substrate and below the backside of the substrate. The lamps for flash annealing are powered and may be controlled via computer control, as shown. With reference back to FIG. 2, for flash annealing the device side of the wafer, only the xenon lamps 20 disposed above the device side of the substrate are powered on and there is substantial uniformity of thermal radiation on the device side of the wafer. In one embodiment of the present invention, flash annealing the wafer is controlled to effect a temperature rise rate in the range of about $10^{4°}$ C. to about $10^{7°}$ C. per second at a temperature of about 500° C. to 1,500° C. for about 0.1 msec to 10 msec and at an annealing pressure of greater than 760 torr. In another embodiment, the flash annealing the wafer is controlled to effect a temperature rise rate in the range of about $10^{5°}$ C. to about $10^{6°}$ C. per second at a temperature of about 1,000° C. to 1,300° C. for about 0.8 msec to 3 msec. It is to be understood that any suitable form of lamp or heating device may be used as a functional equivalent of xenon lamps 20 and that there is no limit as to either the physical arrangement or number of heating devices, which may be employed. Such heating source may include, for example, argon, mercury, quartz halogen, tungsten-halogen lamps, arc, krypton arc, mercury arc, electrodeless radio frequency discharge source, etc. Moreover, it is to be understood that the present invention contemplates the use of any suitable form of energy, which can be applied in a flash mode so long as the heat treatment accomplishes substantially uniform temperature distribution across the entire wafer (thus preventing significant temperature gradients across the wafer), high dopant activation levels, and shallow penetration depth.

In another embodiment of the present invention as depicted in FIG. 3, a cross-sectional view of a semiconductor device 2 shows the formation of a first layer 6 over the device and substrate sides of a substrate 4 and a second layer 8 over the first layers 6 according to one aspect of the invention. First layer 6 is an RPO layer and is used for selective processing of specific areas of the silicon device. RPO layer, which is an oxide, such as silicon dioxide, is deposited by conventional processing over substrate 4 and may have a thickness of about 100 to about 500 angstroms. Second layer 8 or cap dielectric layer is deposited over the first layers 6 by conventional PECVD (plasma enhanced chemical vapor deposition) or LPCVD (low pressure chemical vapor deposition) and may comprise of oxide, silicon dioxide, nitrogen, SiN, SiON, carbon, or amorphous carbon. One purpose of forming first and second layers 6 and 8, respectively on the backside 5 of the substrate 4 is to counter-balance the physical forces or stresses first layer 6 and second layer 8 exerts on the device side 3 of substrate 4 during a subsequent flash anneal processing. In one embodiment, after the step of forming first layer 6 over the device and substrate sides of substrate 4, semiconductor wafer 2 may be subject to an anneal step. In one embodiment, the annealing comprises RTA (rapid thermal annealing) and first layer 6 is annealed to a temperature of about 500° C. to 1,500° C. at a time of less than about 3 milliseconds. Following the formation of first and second layers 6 and 8, respectively, above and below the substrate, both sides of wafer 2 are simultaneously subject to a flash annealing step.

For flash annealing both sides of the wafer, the xenon lamps 20 of FIG. 4 disposed above the device side and below the substrate side of the wafer are powered on and there is substantial uniformity of thermal radiation on both sides of the semiconductor wafer. In one embodiment of the present invention, flash annealing the wafer is controlled to effect a temperature rise rate in the range of about $10^{4\circ}$ C. to about $10^{7\circ}$ C. per second at a temperature of about 500° C. to 1,500° C. for about 0.1 msec to 10 msec and at an annealing pressure greater of than 760 torr. In another embodiment, the flash annealing the wafer is controlled to effect a temperature rise rate in the range of about $10^{5\circ}$ C. to about $10^{6\circ}$ C. per second at a temperature of about 1,000° C. to 1,300° C. for about 0.8 msec to 3 msec. In one embodiment, the flash annealing the wafer is performed on a first side 3 of the wafer followed by a second side 5 of the wafer. In another embodiment, the flash annealing the wafer is performed on a second side 5 of the wafer followed by a first side 3 of the wafer.

As the entire wafer is heated rather than just the device side surface, thermal stress in the wafer is reduced, thereby minimizing wafer distortions and additional damage to the crystal lattice. Embodiments of the present invention are applicable to ion implanted semiconductor wafers. However, it is to be understood that embodiments of the present invention have applications beyond mere activation of implanted dopants and therefore the wafer may be annealed for different purposes. Furthermore, although FIG. 3 shows the formation of two layers on either side of the substrate before subjecting the wafer to a flash anneal, there is no limit as to the number of layers that may be formed on the substrate so long as wafer flatness is substantially achieved according to aspects of the heat treatment methods of the present invention. More generally, it is expected that many types of wafers formed with a plurality of differing materials may benefit from embodiments of the heat treatment methods exemplified herein. Still further, application of the present invention is suitable for heat treatment of large diameter semiconductor wafers.

Figure 5:
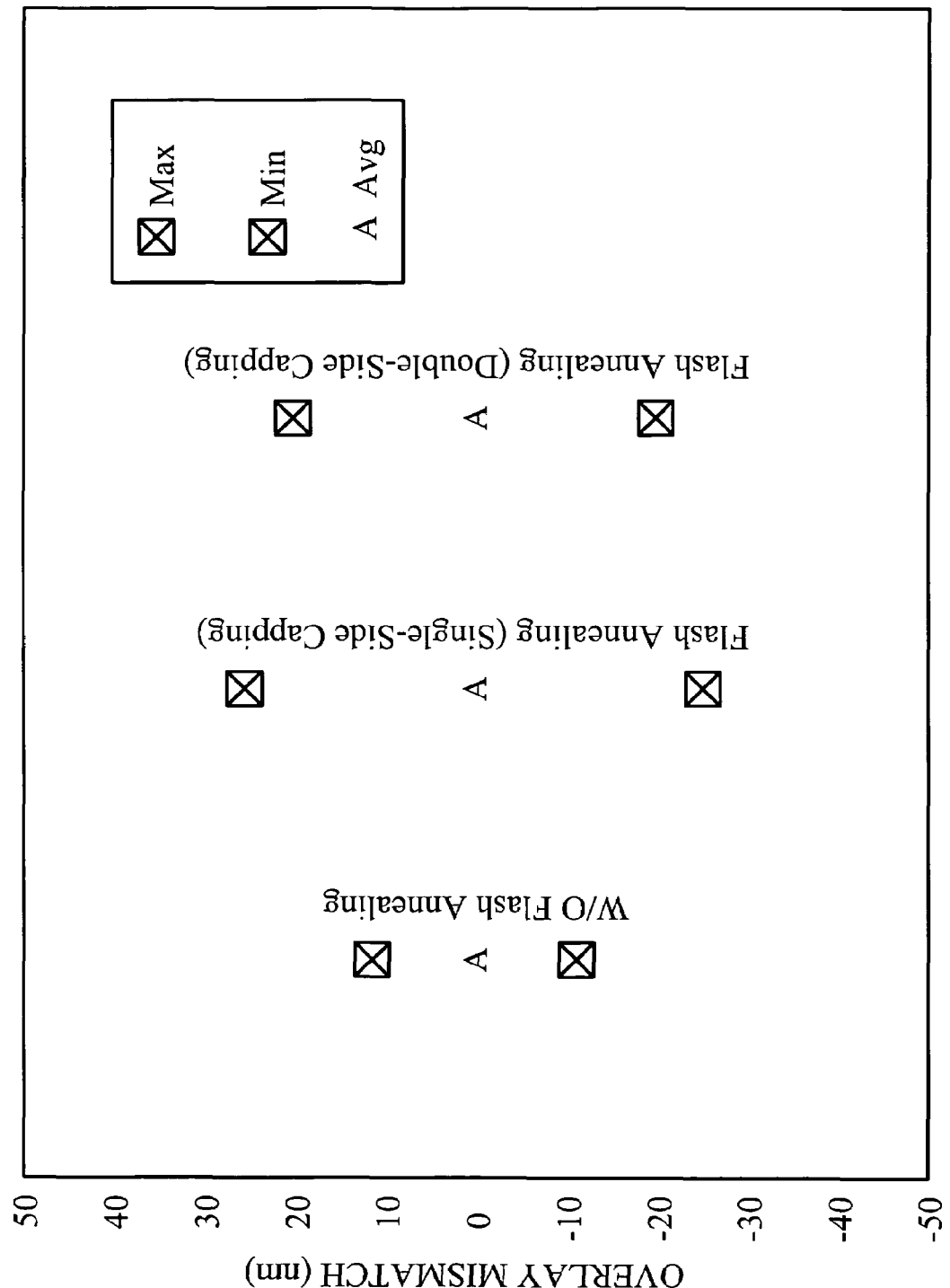
FIG. 5 is a graph showing overlay mismatch data at different processings according to one aspect of the invention.

FIG. 5 is a graph showing overlay mismatch data at different processings according to one aspect of the invention. The overlay mismatch in nanometers is plotted against three random data samples at three different processings. From the graph, a wafer having at least two layers on both sides thereof after having undergone flash annealing shows a lower maximum and minimum overlay mismatch value when compared to the a flash annealed wafer with only one sided layering, or about a 20% improvement. For comparison purpose, the wafer that has not been subjected to a flash annealing process shows very little overlay mismatch, in the 10 to −10 nm range.

Figure 6:
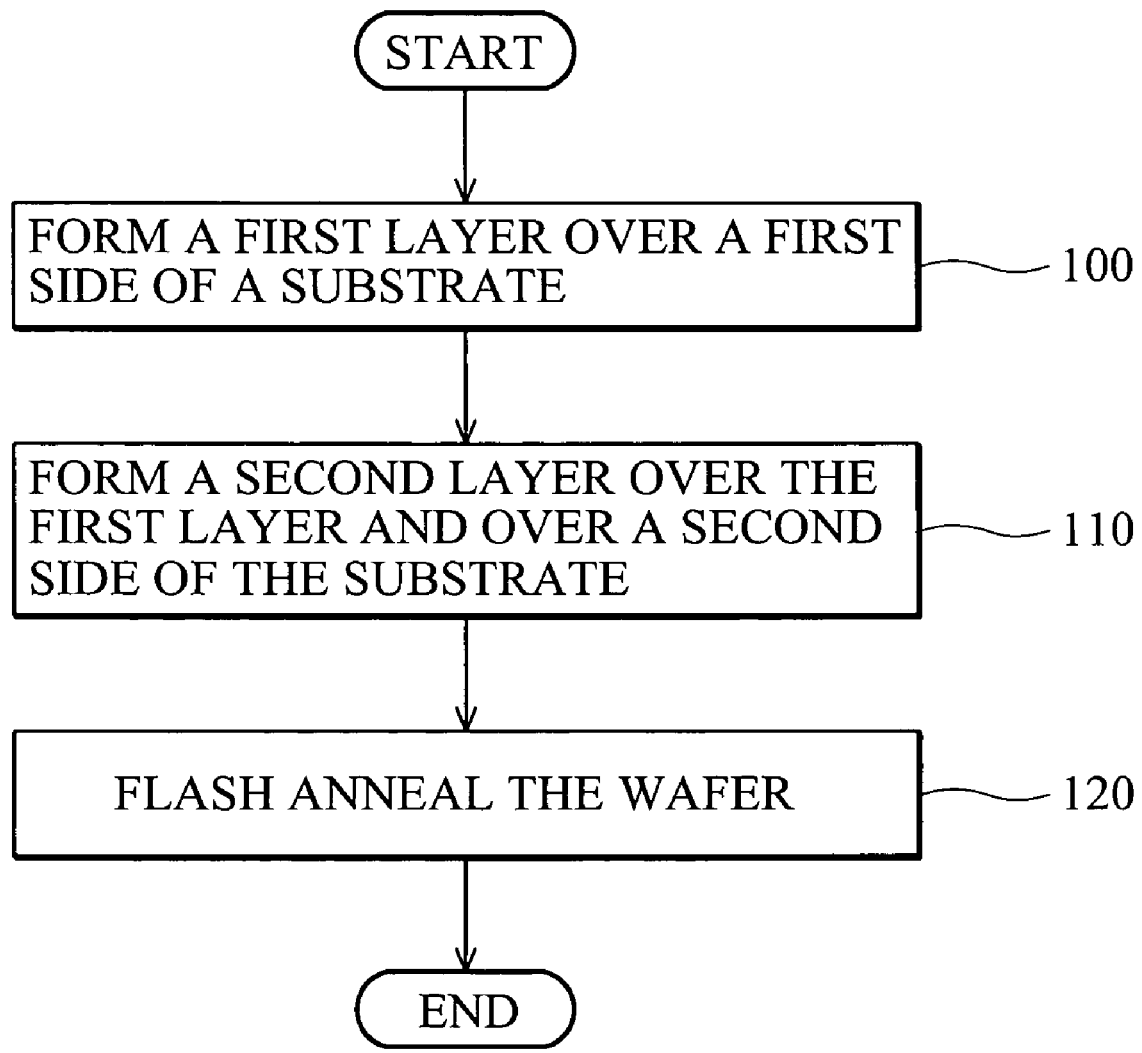
FIG. 6 is a flow chart of a method of heat treating a semiconductor wafer according to one aspect of the invention.

FIG. 6 is a flow chart of a method of heat treating a semiconductor wafer according to one aspect of the invention. The heat treating routine begins with a first block 100 where a first layer is formed over a first side of a substrate. In block 110, a second layer is formed over the first layer and over a second side of the substrate. Thereafter, in block 120 the wafer is flash annealed to achieve a wafer that is substantially flat. The heat treatment routine is then ended.

In the preceding detailed description, the present invention is described to show applicability of rapid annealing of an ion implanted semiconductor wafer and with reference to specifically exemplary embodiments thereof. It will, however, be evident that various modifications, processes, structures, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for treating a semiconductor wafer comprising:
   forming a first layer over a first side of a substrate;
   forming a second layer over the first layer and over a second side of the substrate;
   annealing the first layer; and
   flash annealing the wafer after annealing the first layer.

2. The method of claim 1, wherein the semiconductor wafer is dopant-implanted.

3. The method of claim 1, wherein the first side is a device side and the second side is a substrate side.

4. The method of claim 1, wherein the annealing comprises rapid thermal annealing.

5. The method of claim 1, wherein the first layer is annealed to a temperature of about 500° C. to about 1,500° C. at a time of less than about 3 milliseconds.

6. The method of claim 1, wherein the second layer comprises nitrogen.

7. The method of claim 1, wherein the second layer comprises SiN.

8. The method of claim 1, wherein the second layer comprises SiON.

9. The method of claim 1, wherein the second layer comprises carbon.

10. The method of claim 1, wherein the second layer comprises amorphous carbon.

11. The method of claim 1, wherein the second layer comprises oxide.

12. The method of claim 1, wherein the flash annealing the wafer is controlled to affect a temperature rise rate in the range of about 104° C. to about 107° C. per second at a temperature of about 500° C. to about 1,500° C. for about 0.1 msec to 10 msec and at an annealing pressure of greater than about 760 torr.

13. The method of claim 1, wherein the flash annealing the wafer is controlled to effect a temperature rise rate in the range of about 105° C. to about 106° C. per second at a temperature of about 1,000° C. to 1,300° C. for about 0.8 msec to about 3 msec.

14. The method of claim 1, wherein the first layer comprises oxide.

15. The method of claim 14, wherein the first layer is silicon dioxide having a thickness of about 100 to about 500 angstroms.

16. A method of treating a semiconductor wafer comprising:
    forming a first layer over a first side of a substrate and over a second side of the substrate;
    forming a second layer over the first layer; annealing the first layer; and
    flash annealing the wafer after annealing the first layer.

17. The method of claim 16, wherein the semiconductor wafer is dopant-implanted.

18. The method of claim 16, wherein the first side is a device side and the second side is a substrate side.

19. The method of claim 16, wherein the annealing comprises rapid thermal annealing.

20. The method of claim 16, wherein the first layer is annealed to a temperature of about 500° C. to about 1,500° C. at a time of less than about 3 milliseconds.

21. The method of claim 16, wherein the first layer comprises oxide.

22. The method of claim 16, wherein the first layer is silicon dioxide having a thickness of about 100 to about 500 angstroms.

23. The method of claim 16, wherein the second layer comprises nitrogen.

24. The method of claim 16, wherein the second layer comprises carbon.

25. The method of claim 16, wherein the second layer comprises oxide.

26. The method of claim 16, wherein the flash annealing the wafer is controlled to effect a temperature rise rate in the range of about 104° C. to about 107° C. per second at a temperature of about 500° C. to about 1,500° C. for about 0.1 msec to 10 msec.

27. The method of claim 16, wherein the flash annealing the wafer is controlled to effect a temperature rise rate in the range of about 105° C. to about 106° C. per second at a temperature of about 1,000° C. to 1,300° C. for about 0.8 msec to about 3 msec.

28. The method of claim 16, wherein the flash annealing the wafer is performed on a first side of the wafer followed by a second side of the wafer.

29. The method of claim 16, wherein the flash annealing the wafer is performed on a second side of the wafer followed by a first side of the wafer.

30. The method of claim 16, wherein the flash annealing the wafer is performed simultaneously on both sides of the wafer.

* * * * *